United States Patent [19]

Mobley et al.

[11] 4,105,968

[45] Aug. 8, 1978

[54] ELECTRICAL TESTER HAVING RETRACTABLE PRONGS AND A RETRACTABLE TEST ROD FOR INDICATING PRESENCE OF A VOLTAGE

[75] Inventors: Robert L. Mobley; Della Mobley, both of Henry, Tenn.

[73] Assignee: The Raymond Lee Organization, Inc., New York, N.Y.

[21] Appl. No.: 786,990

[22] Filed: Apr. 13, 1977

[51] Int. Cl.² .................. G01R 19/16; G01R 31/02; G01R 1/06
[52] U.S. Cl. .............................. 324/133; 324/51; 324/72.5; 324/149; 339/34; 339/108 TP
[58] Field of Search .......... 324/51, 72.5, 133, 149, 324/53; 339/34, 42, 108 TP

[56] References Cited

U.S. PATENT DOCUMENTS

| 2,443,975 | 6/1948 | Baker | 339/34 |
|---|---|---|---|
| 2,607,829 | 8/1952 | Tipperman | 324/53 |
| 2,705,773 | 4/1955 | Ward | 324/51 X |
| 2,780,801 | 2/1957 | Tyler | 324/51 X |
| 3,416,074 | 12/1968 | Schoonover | 324/72.5 X |
| 3,458,794 | 7/1969 | Bohnstedt et al. | 339/34 X |
| 3,926,494 | 12/1975 | Maillaro | 339/34 |
| 3,973,193 | 8/1976 | Hayes | 324/51 |
| 4,001,803 | 1/1977 | Lombardo | 339/34 X |
| 4,027,236 | 5/1977 | Stewart | 324/51 |

Primary Examiner—Gerard R. Strecker
Attorney, Agent, or Firm—Howard I. Podell

[57] ABSTRACT

An electrical tester adaptable for indicating the electrical condition of a conventional female electrical outlet or for indicating the electrical energization of two remote contact locations. The tester is in the form of a housing enclosing a test lamp, with a pair of male electrical prongs each connected to a different terminal of the lamp, and with the prongs fixed to a slidable block so as to be retractable into the housing when not in use. A metal test rod is slidably mounted in the housing so as to project beyond the housing in a test position, and a flexible test lead is fitted in a recess in the housing closed by a slidable door. The test rod and the test lead are each connected to a different lamp terminal.

1 Claim, 4 Drawing Figures

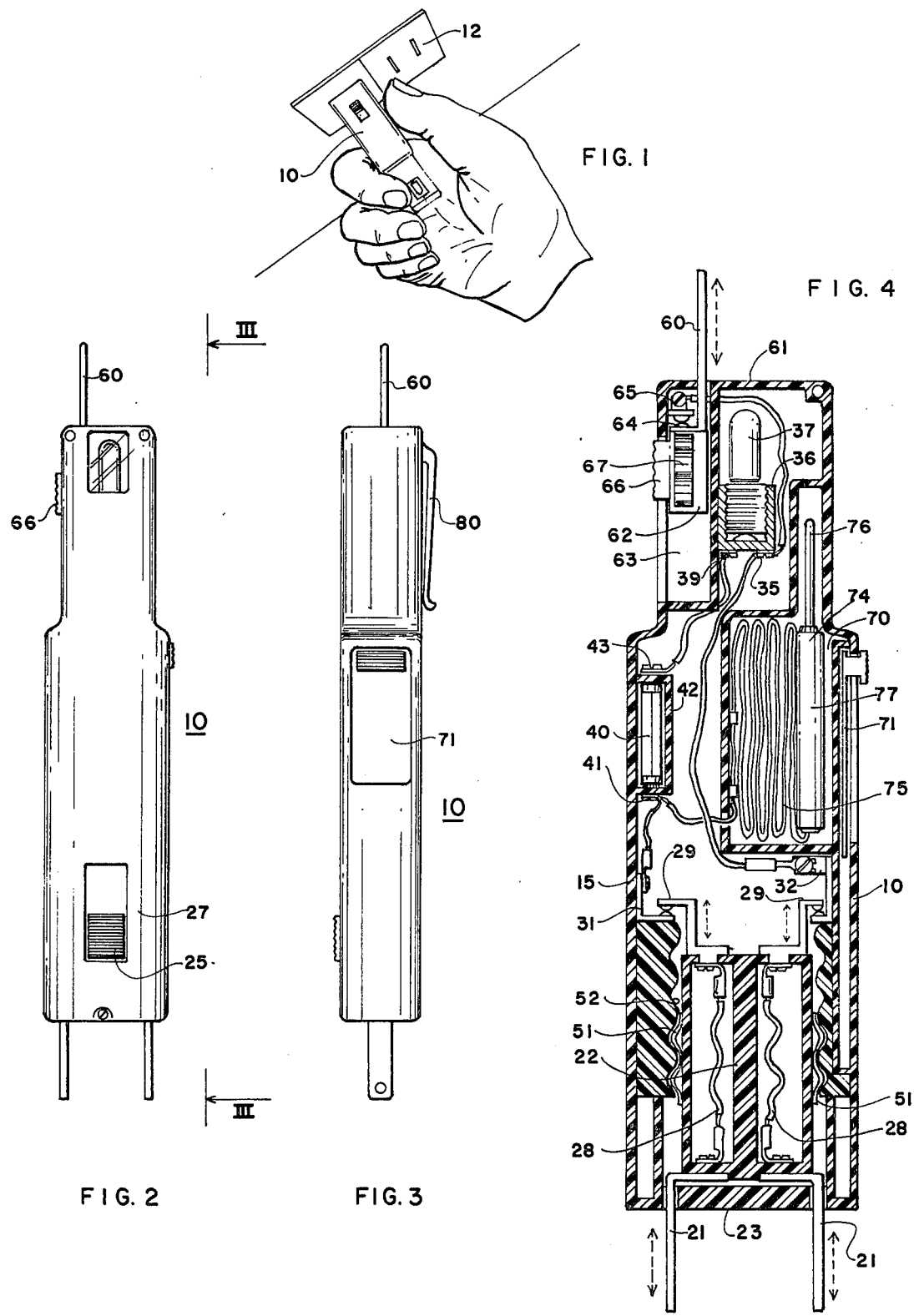

4,105,968

ELECTRICAL TESTER HAVING RETRACTABLE PRONGS AND A RETRACTABLE TEST ROD FOR INDICATING PRESENCE OF A VOLTAGE

SUMMARY OF THE INVENTION

Our invention is an electrical tester adaptable for indicating the electrical condition of a conventional female electrical outlet or for indicating the electrical energization of two remote contact locations. The tester is in the form of a housing enclosing a test lamp, with a pair of male electrical prongs each connected to a different terminal of the lamp, and with the prongs fixed to a slidable block so as to be retractable into the housing when not in use. A metal test rod is slidably mounted in the housing so as to project beyond the housing in a test position, and a flexible test lead is fitted in a recess in the housing closed by a slidable door. The test rod and the test lead are each connected to a different lamp terminal.

BRIEF DESCRIPTION OF THE DRAWINGS:

The objects and features of the invention may be understood with reference to the following detailed description of an illustrative embodiment of the invention, taken together with the accompanying drawings in which:

FIG. 1 is a perspective view of the invention in use;
FIG. 2 is a front view of the invention;
FIG. 3 is a side view of the invention, taken along line III—III of FIG. 2; and
FIG. 4 is a front sectional view of the invention.

DESCRIPTION OF THE PREFERRED EMBODIMENT:

Turning now descriptively to the drawings, in which similar reference characters denote similar elements throughout the several views, FIGS. 1-4 illustrate the tester unit 10 which may be hand-held and plugged into a wall outlet socket 12 to determine if the contacts of the socket 12 are electrically energized, or alternately employed to determine whether two remotely located electrical contacts (not shown) are electrically energized.

As shown in FIGS. 2-4, a pair of spaced male metal prongs 21 are each fixed to an insulator block 22 that is slidably mounted inside of housing 15 so as to extend or retract prongs 21 at end surface 23 of the housing. Block 22 is joined to a slide tabe 25 fitted in a slot in the exterior housing wall 27 so as to slide the block 22 as desired.

Each prong 21 is connected by an individual wire 28 to a metal spring clip 29 projecting above the block 22 and each located to engage an electrical contact clip 31 or 32 internally fixed to the housing. Contact clip 32 is connected to a first terminal 35 of a lamp socket 36 in which a light bulb 37 is retained and contact clip 31 is connected to a first terminal 41 of a fuse socket 42 in which a fuse 40 is retained with second terminal 43 of fuse socket 42 connected to second terminal 39 of the lamp socket 36.

Prongs 21 are thus electrically connected to the fuse and lamp bulb contacts only when the prongs are fully extended from the housing. A corrugated shaped ribbon spring 51 is externally to each of the opposed sides of block 22 to frictionally engage corrugations 52 in the internal wall surfaces of housing 15 so as to hold block 15 in place, except when manually moved by the user sliding slide tab 25.

A metal test rod 60 is slidably mounted to extend beyond or retract inside of housing end wall 61 with rod 60 fixed to an insulator block 62 slidably mounted in a compartment 63 in the housing. Rod 60 is joined to a metal tab 64 on the end of block 62 which contacts an electrical contact clip 65 fixed internally to housing 15, in the fully extended position of rod 60. A slide tab 66, joined to block 62, extends through a slot in the wall of the housing to furnish a manual grip for sliding block 62 and rod 60. A bent ribbon spring 67, fixed to block 62 frictionally engages an internal wall of compartment 63 to hold block 62 in place.

Electrical contact clip 65 is electrically connected to first lamp socket contact 35.

An interior compartment 70 in housing 15 is blocked by a slidable door 71 in the closed position of door 71 and contains a flexible test lead unit 74, consisting of a folded flexible insulated wire 75 connected at one end to first fuse socket contact 41 and at the other end to a metal test prod 76 fixed to an insulated tubing 77. When door 71 is slid to the open position, test prod 76 and attached wire 75 may be removed so as to test for voltage between remote contact points (not shown) one of which is contacted by test prod 76 and the other by extended test rod 60, with lamp 37 serving as the voltage indicator.

Fuse 40 protects the circuitry in the event that current through lamp 37 is excessive due to excessive voltage across the remote contact points.

A spring clip 80 is externally fixed to the housing 15 to serve as a means of retaining housing 15, when not in use, in a pocket of the user.

Since obvious changes may be made in the specific embodiment of the invention described herein, such modifications being within the spirit and scope of the invention claimed, it is indicated that all matter contained herein is intended as illustrative and not as limiting in scope.

Having thus described the invention, what we claim as new and desire to secure by Letters Patent of the United States is:

1. An electrical test unit for alternatively indicating voltage in the female contacts of a wall outlet or at two remote electrical contacts, comprising a housing in which a pair of electrical male prongs are mounted to a slidable block positioned to extend the two prongs beyond the housing in a first fully extended position or to retract the two prongs within the housing in a second retracted position, an electrical light bulb electrically connected to a pair of contact clips, each of which is mounted in the housing so as to connect to an individual contact means, each contact means being detachably engaged by a separate terminal mounted on said slidable block and electrically connected to a respective one of said prongs in the first fully extended position of the prongs so as to electrically connect a said prong to a said contact clip, together with an interior chamber located in the housing in which a flexible test lead is stored, said chamber blocked by a door in a wall of the housing, said housing also fitted with a slidable metal test rod slidably mounted to extend beyond the housing in a first fully extended position and to slidably retract within the housing in a second retracted position, said test rod detachably engaged to contact means, in the first fully extended position, which contact means are electrically connected to one of the contact clips of the light bulb, said contact means fixed to the interior of the housing, and said test lead connected internally to a second of the contact clips of the light bulb, in which the metal prongs are electrically disengaged from their contact means when moved from the first fully extended position towards the second retracted position, and in which the test rod is electrically disengaged from its contact means when moved from the first fully extended position towards the second retracted position, such that neither of the metal prongs nor the test rod are electrically connected to the internal circuitry of the tester except when in a fully extended position.

* * * * *